(12) United States Patent
Kawase et al.

(10) Patent No.: US 11,442,627 B2
(45) Date of Patent: Sep. 13, 2022

(54) DATA COMPRESSION UTILIZING LOW-RATIO COMPRESSION AND DELAYED HIGH-RATIO COMPRESSION

(71) Applicant: INTERNATIONAL BUSINESS MACHINES CORPORATION, Armonk, NY (US)

(72) Inventors: Ryohta Kawase, Machida (JP); Eiji Tosaka, Kita-ku (JP); Kousei Kawamura, Koto-ku (JP); Koichi Masuda, Tokyo (JP); Shinsuke Mitsuma, Machida (JP)

(73) Assignee: International Business Machines Corporation, Armonk, NY (US)

( * ) Notice: Subject to any disclaimer, the term of this patent is extended or adjusted under 35 U.S.C. 154(b) by 663 days.

(21) Appl. No.: 16/439,789

(22) Filed: Jun. 13, 2019

(65) Prior Publication Data

US 2020/0393968 A1    Dec. 17, 2020

(51) Int. Cl.
G06F 3/06    (2006.01)
(52) U.S. Cl.
CPC ............ G06F 3/0608 (2013.01); G06F 3/064 (2013.01); G06F 3/0661 (2013.01); G06F 3/0674 (2013.01)
(58) Field of Classification Search
CPC ...... G06F 3/0608; G06F 3/064; G06F 3/0661; G06F 3/0674
See application file for complete search history.

(56) References Cited

U.S. PATENT DOCUMENTS

| 5,467,087 A | * | 11/1995 | Chu | .................... H03M 7/3086 341/86 |
| 5,805,932 A | * | 9/1998 | Kawashima | ........ H03M 7/3088 711/111 |
| 6,256,421 B1 | * | 7/2001 | de Queiroz | ............. G06T 9/008 382/253 |

(Continued)

OTHER PUBLICATIONS

US 10,045,018 B2, 08/2018, Fallon et al. (withdrawn)

(Continued)

*Primary Examiner* — Debbie M Le
*Assistant Examiner* — Huen Wong
(74) *Attorney, Agent, or Firm* — Anthony M. Pallone

(57) ABSTRACT

An embodiment of the invention may include a method, computer program product and system for saving data received from a host computing device to a storage system. The storage system includes at least one processor and at least one storage. An embodiment may include storing the received data to the storage on a record basis. A record includes a record header including information indicative of an implemented compression method of the record. An embodiment may include monitoring a processing load of the at least one processor. In response to the processing load being less than a predetermined level, an embodiment may include further compressing the record utilizing a high-ratio compression method based on the record requiring further compression. An embodiment may include updating the record header information to reflect details of the utilized a high-ratio compression method. An embodiment may include storing the further compressed record to the storage.

17 Claims, 7 Drawing Sheets

(56) References Cited

U.S. PATENT DOCUMENTS

| | | | | |
|---|---|---|---|---|
| 6,671,772 | B1* | 12/2003 | Cousins | G06F 16/10 707/999.102 |
| 7,009,533 | B1* | 3/2006 | Wegener | H04N 1/413 341/87 |
| 7,831,639 | B1* | 11/2010 | Panchbudhe | G06F 16/10 711/170 |
| 8,295,615 | B2* | 10/2012 | Celi, Jr. | H04L 67/1095 382/232 |
| 9,564,918 | B2 | 2/2017 | Asher et al. | |
| 9,852,056 | B2 | 12/2017 | Arges et al. | |
| 2003/0228063 | A1* | 12/2003 | Nakayama | H04N 19/60 375/E7.139 |
| 2005/0063599 | A1* | 3/2005 | Sato | H04N 19/647 375/E7.199 |
| 2006/0153291 | A1* | 7/2006 | Christison | H04N 19/164 375/E7.173 |
| 2007/0208893 | A1* | 9/2007 | Azzarello | G06F 16/1744 710/68 |
| 2007/0237176 | A1* | 10/2007 | Bartlett | H04L 12/2883 370/468 |
| 2009/0210943 | A1* | 8/2009 | Alon | G06F 21/564 707/999.2 |
| 2010/0036863 | A1* | 2/2010 | Koifman | H03M 7/30 707/602 |
| 2011/0320417 | A1* | 12/2011 | Luo | G06F 16/22 707/693 |
| 2013/0275396 | A1* | 10/2013 | Condict | H03M 7/30 707/693 |
| 2013/0314429 | A1* | 11/2013 | Croxford | G06T 1/60 345/531 |
| 2014/0207745 | A1* | 7/2014 | Groseclose | H03M 7/30 707/693 |
| 2015/0156284 | A1* | 6/2015 | Akhter | H04L 69/22 370/477 |
| 2016/0309363 | A1* | 10/2016 | Persson | H04L 69/22 |
| 2017/0123704 | A1 | 5/2017 | Sharma et al. | |
| 2019/0012120 | A1* | 1/2019 | Watanabe | G06K 15/1857 |
| 2019/0079799 | A1* | 3/2019 | Kumar | G06F 9/4843 |

OTHER PUBLICATIONS

Mell et al., "The NIST Definition of Cloud Computing", Recommendations of the National Institute of Standards and Technology, NIST Special Publication 800-145, Sep. 2011, 7 pages.

* cited by examiner ated States Patent

DATA COMPRESSION UTILIZING LOW-RATIO COMPRESSION AND DELAYED HIGH-RATIO COMPRESSION

BACKGROUND

Embodiments of the present invention relate generally to the fields of computing devices and data storage, and more specifically, to implementing a high data compression ratio while avoiding excess CPU usage on host I/O operations by utilizing low-ratio compression and delayed high-ratio compression with data record header information.

In today's society, computer systems are commonly found in the workplace, in homes, and at schools. The data produced by this widespread distribution and use of computer systems continues to grow exponentially. As a result, computer systems may include data storage subsystems to process and store data. Data storage subsystems may utilize mediums such as hard disks, tape media, virtual tape, and other virtual storage components for data storage.

Data compression is widely used to reduce the amount of data required to process, transmit, or store a given quantity of information. Data compression is the coding of data to minimize its representation. Compression can be used, for example, to reduce the storage requirements for files, to increase the communication rate over a channel, or to reduce redundancy prior to encryption for greater security. However, data compression consumes a significant amount of computing (e.g., central processing unit "CPU") resources.

BRIEF SUMMARY

An embodiment of the invention may include a method, computer program product and system for saving data received from a host computing device to a storage system. The storage system includes at least one processor and at least one storage. An embodiment may include storing the received data to the storage on a record basis. A record includes a record header including information indicative of an implemented compression method of the record. An embodiment may include monitoring a processing load of the at least one processor of the storage system. In response to the processing load being less than a predetermined level, an embodiment may include further compressing the record utilizing a high-ratio compression method based on the record requiring further compression. An embodiment may include updating the record header information to reflect details of the utilized a high-ratio compression method. An embodiment may include storing the further compressed record to the storage.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION

Figure 1:
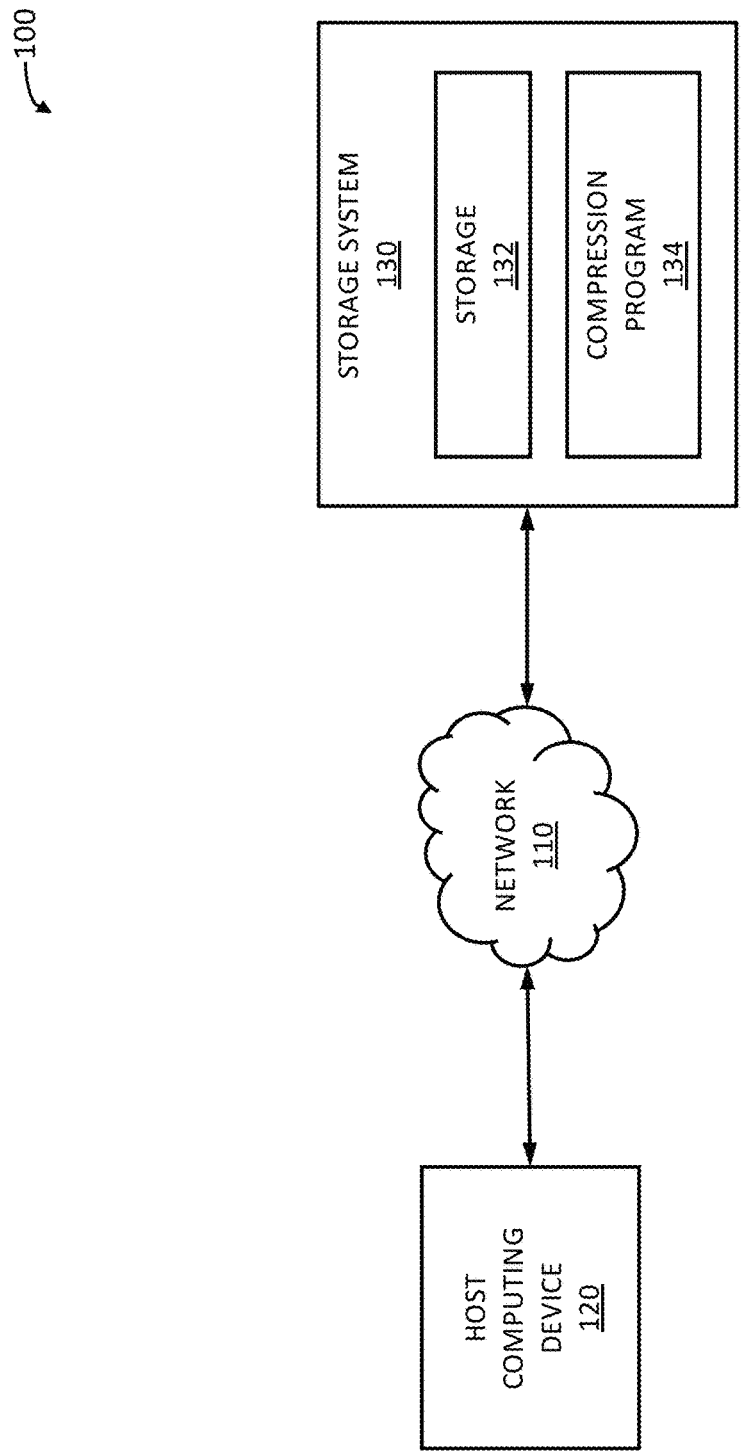
FIG. 1 is a block diagram illustrating a high data compression (HDC) system, in accordance with an embodiment of the present invention.

As previously mentioned, data compression consumes a significant amount of computing (e.g., central processing unit "CPU") resources. According to at least one definition, data compression is a reduction in the number of bits needed to represent data and may be performed by a program that uses a compression algorithm to determine how to shrink the size of the data. Different compression algorithms compress data at different "compression ratios." A compression ratio is the ratio between the uncompressed size of the data (e.g., original size) and the compressed size of the data. Consequently, the time and computing resources required for compression depends upon the desired compression ratio.

Computer systems may implement storage subsystems to compress data in order to reduce the amount of storage space (e.g., memory, disk space) required to store data. In addition to saving storage capacity for computer systems, data compression can also increase file transfer rates and decrease costs for storage hardware and network bandwidth. However, although selecting an algorithm to achieve high-ratio compression is typically preferred for memory utilization purposes, these high-ratio compression algorithms typically require an increased amount of time and processor resources to compress/decompress data when compared to low-ratio compression algorithms.

Many storage subsystems, such as hard disks, tape media, and virtual tape, adopt data compression primarily for increasing virtual storage capacity. Moreover, use of data compression is also very advantageous in that performance of the I/O operations of a host computing device (e.g., IBM Z®) is improved because of reduction in the size of data actually written to storage.

Some storage subsystems utilize data compression by CPU, not by compression hardware, to get a higher compression ratio. However, high-ratio compression by CPU may sometimes negatively impact performance of the whole subsystem due to high CPU utilization. There is a conventional method that executes background compression process for once saved non-compressed data. However, that method cannot take advantage of improved host I/O operation performance which may be obtained by a reduced amount of data to be written to storage. In addition, such a background compression process may take long time because the process involves reading, compressing, and rewriting data compressed with a sufficient compression ratio even for a large-sized file.

There are many conventional methods of two-staged compression, for the purpose of increasing the compression ratio, which execute a second compression on data compressed by a first compression. However, execution of such methods tends to be CPU intensive. Furthermore, their decompression requires double decompression processes; one process for the second compression and one process for the first compression.

In an effort to mitigate the problems stated above, embodiments of the present invention may include a high data compression (HDC) system 100, described below, which provides a method for implementing a high data compression ratio utilizing low-ratio compression and delayed high-ratio compression with data record header information. HDC system 100 may improve the performance and capacity of a storage subsystem by improving host write I/O performance through data record compression and storing of data records with as high compression ratio as possible while making as little influence as possible to the performance of the whole storage subsystem. Through initial use of either a low-ratio compression method with a low CPU load or compression hardware to avoid excess CPU utilization which negatively influences the performance of the whole subsystem, HDC system 100 may allow a host write I/O operation to write a smaller amount of data to the storage than otherwise would be written with no data compression and thereby improves the performance of the host write I/O operation. Afterwards, while HDC system 100 is not processing a host I/O operation, HDC system 100 may implement a background re-compression process to internally read out a written data record, decompress the read data record, compress the decompressed data record with a high compression ratio, and write the compressed data record back to storage. This background re-compression process compresses data with a high compression ratio to increase the substantial capacity of the storage.

In embodiments of the present invention, the background re-compression process may selectively choose a data record to be re-compressed by consulting record header information. A header may be added to a data record in embodiments where HDC system 100 may process data on a record basis. For instance, the IBM® TS7700 virtual tape device processes data on a record basis, and, when writing a data record, adds a header which may include a record ID, information indicative of an implemented compression method, and lengths of the record before and after compression of the record (IBM and all IBM—based trademarks and logos are trademarks or registered trademarks of International Business Machines Corporation and/or its affiliates). As an example of selectively choosing a data record, the background re-compression process may select only records that have been compressed with a low compression ratio in the initial compression. A benefit of the selective manner by which data records are chosen to be re-compressed is that the processing time for the background re-compression process is reduced.

In embodiments of the present invention, HDC system 100 may enable a host read I/O operation to use a corresponding decompression method(s) per record to decompress the data record. HDC system 100 may read header information of the requested data record in order to identify the corresponding decompression method(s) to be used.

Embodiments of the present invention will now be described in detail with reference to the accompanying Figures.

FIG. 1 is a functional block diagram illustrating high data compression system 100, in accordance with an embodiment of the present invention. In an example embodiment, HDC system 100 may include host computing device 120 and storage system 130, interconnected via network 110.

Although FIG. 1 depicts only a single host computing device 120 and storage system 130, one or more of a host computing device 120 and storage system 130 may be present within HDC system 100.

In various embodiments, network 110 is a communication channel capable of transferring data between connected devices. In an example embodiment, network 110 may be a fibre channel fabric, a fibre channel point to point link, a fibre channel over ethernet fabric or point to point link, a fibre connection (FICON) or enterprise systems connection (ESCON) I/O interface, any other I/O interface type, a wireless network, a wired network, a LAN, a WAN, heterogeneous, homogeneous, public (i.e. the Internet), private (e.g., intranet network), or any combination thereof to support communications between devices connected to network 110. In general, network 110 can be any combination of connections and protocols that will support communications between host computing device 120 and storage system 130.

In an example embodiment, host computing device 120 may be a laptop computer, a notebook, a tablet computer, a netbook computer, a personal computer (PC), a desktop computer, a workstation, a server system, or any other electronic device or computing system capable of sending, and receiving data to and from other computing devices such as storage system 130, via network 110, and capable of supporting the functionality required of embodiments of the invention. For example, host computing device 120 may be an IBM Z® mainframe, running Z/OS® management software, operable to transmit and/or receive data to/from storage system 130 on behalf of one or more client computers (not shown) (IBM Z and Z/OS are registered trademarks of International Business Machines, Corporation in the United States and other countries). In embodiments of the present invention, host computing device 120 may send data record read/write I/O operations for processing by storage system 130. The read/write I/O operations sent by host computing device 120 may pertain to data records stored on storage system 130 and accessible by host computing device 120. While host computing device 120 is shown as a single device, in other embodiments, host computing device 120 may be comprised of a cluster or plurality of computing devices, working together or working separately. Host computing device 120 may be described, generally, with respect to FIG. 5 below. In an example embodiment, host computing device 120 may transmit, via network 110, a data record write I/O operation to storage system 130.

In an example embodiment, storage system 130 may include storage 132 and compression program 134. Storage system 130 may be a desktop computer, a blade server, a networked computer appliance, a virtual device, or any other networked electronic device or computing system capable of storing data and receiving/sending data from/to other computing devices such as host computing device 120, via network 110, and capable of supporting the functionality required of embodiments of the invention. For example, storage system 130 may be an enterprise virtual tape library (VTL) storage system such as the IBM® TS7700 which archives and processes data on a record basis. In an example embodiment, storage system 130 may function to process data record read/write I/O operations received from host computing device 120, via network 110. In an example embodiment, storage system 130 may, when writing a data record, add a data record header which comprises a record ID and information indicative of a compression method (e.g., compression ratio) and record lengths of the record before and after a compression method is applied to the data record. While storage system 130 is shown as a single device, in other embodiments, storage system 130 may be comprised of a cluster or plurality of computing devices, working together or working separately. Storage system 130 may be described generally with respect to FIG. 5 below.

In various embodiments, storage 132 may be a device used for data storage and retrieval. Storage 132 may include, as examples, one or more of a hard drive, a solid-state disk, an optical disk, physical and/or virtual tape drives, flash memory, or any combination thereof. In embodiments of the invention, storage 132 may be physically comprised of one or more storage devices, such as storage arrays. A storage array may be a logical grouping of individual storage devices, such as a hard disk. In certain embodiments, storage 132 is comprised of a JBOD (Just a Bunch of Disks) array or a RAID (Redundant Array of Independent Disks) array. A collection of physical storage arrays may be further combined to form a rank, which dissociates the physical storage from the logical configuration. The storage space in a rank may be allocated into logical volumes, which define the storage location specified in a write/read request. In embodiments of the invention, data stored in storage 132 may be processed (e.g., read, written) on a data record basis.

In an example embodiment, compression program 134 may be a program, or subroutine contained in a program, that may perform two-staged data compression on a data record basis. In implementing a two-staged compression on a given data record, compression program 134 may increase the compression ratio for the given data record. In embodiments of the present invention, compression program 134 may perform a first compression on a data record, via a computer processor of storage system 130, utilizing a low-ratio compression method. In other embodiments, compression program 134 may perform the first compression via compression hardware (not shown) of storage system 130 in order to avoid excess utilization of a computer processor or storage system 130. Furthermore, in embodiments of the invention, compression program 134 may operate as a background process to select already compressed data records for a second compression utilizing a high-ratio compression method. Compression program 134 may perform the second compression via a computer processor of storage system 130 or via compression hardware (not shown) of storage system 130. In an example embodiment, compression program 134 may select an already compressed data record for a second compression utilizing a high-ratio compression method based on the data record having been initially compressed utilizing a compression method having a ratio smaller than a threshold value. The operations and functions of compression program 134 are described in further detail below with regard to FIG. 4.

Figure 2:
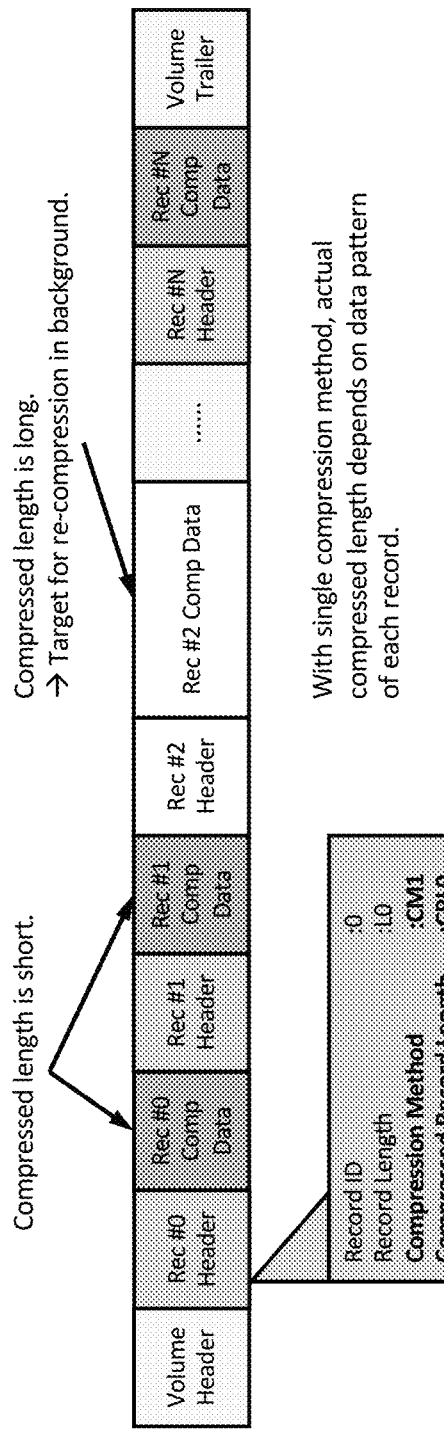
FIG. 2 is a generalized diagram of a virtual volume used to store data records in storage 132 of FIG. 1 utilizing a single compression method on a record basis.

FIG. 2 is a representation of a virtual volume used in a virtual tape storage (VTS) system (e.g., within storage 132 of storage system 130 of FIG. 1) to store data records of host computing device 120 utilizing a single compression method on a record basis. In various embodiments, a virtual volume includes a volume header, at least one data record header, compressed record data corresponding to the at least one data record header, and a volume trailer. Within a VTS system, there may be a plurality of virtual volumes, each identified by a unique volume identifier. As illustrated by FIG. 2, where only a single compression method is utilized, actual compressed data record length depends on the data pattern of each record. Moreover, where only a single compression method is utilized, compressed data record length may still be long. For example, rec #2 compressed data length may remain long despite being subjected to the single compression method (e.g., a low-ratio compression method) and may therefore be a target for re-compression by compression program 134.

Figure 3:
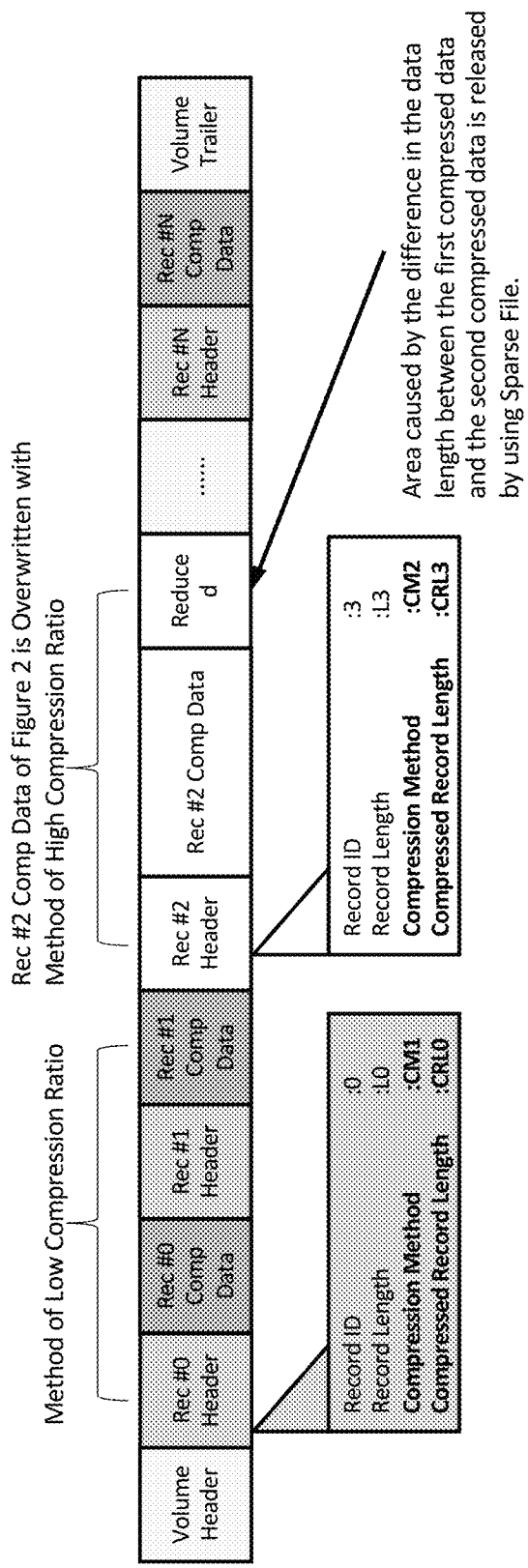
FIG. 3 is a generalized diagram of a virtual volume used to store a mixture of data records in storage 132 of FIG. 1 utilizing multiple compression methods.

FIG. 3 is a representation of a virtual volume used in a virtual tape storage (VTS) system (e.g., within storage 132 of storage system 130 of FIG. 1) to store data records of host computing device 120 where multiple compression methods (e.g., a low-ratio compression method and a high-ratio compression method) have been applied to one or more of the data records. In various embodiments, a virtual volume includes a volume header, at least one data record header, compressed record data corresponding to the at least one data record header, and a volume trailer. Within a VTS system, there may be a plurality of virtual volumes, each identified by a unique volume identifier. As illustrated by FIG. 3, rec #2 compressed data of FIG. 2 may be overwritten, by compression program 134, utilizing a high-ratio compression method. Consequently, a free data space (e.g., "Reduce d" of FIG. 3) may be created whose length corresponds to the difference between the first compressed data and the second compressed data.

Figure 4:
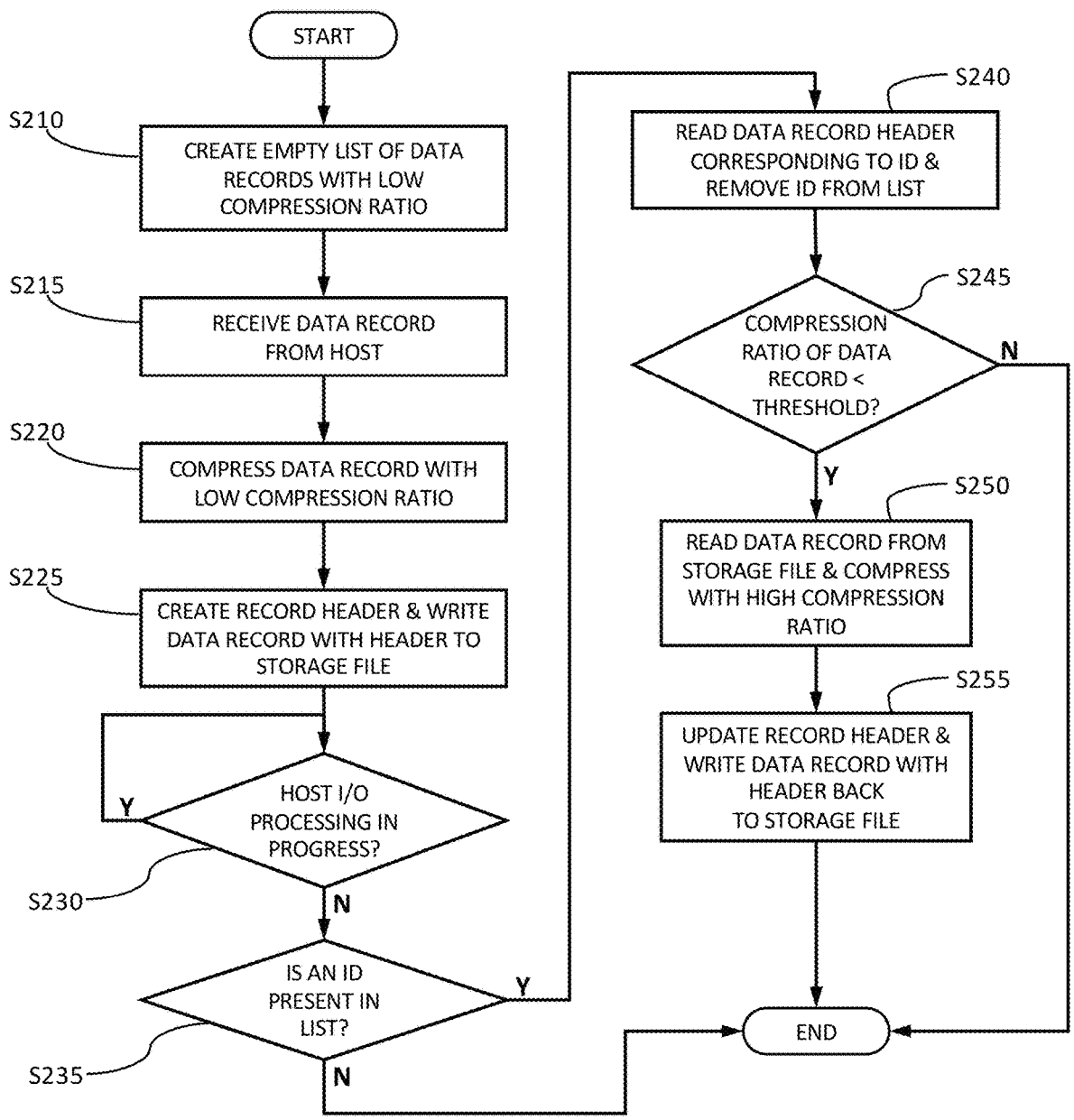
FIG. 4 is a flowchart illustrating the operations of compression program 134 of FIG. 1, in accordance with an embodiment of the invention.

FIG. 4 shows a flowchart illustrating the operations of compression program 134 in accordance with an example embodiment of the invention. Referring to step S210, upon initialization, compression program 134 may create an empty list which will contain one or more IDs which correspond to and identify data records which have been subjected to a first compression processing. Compression program 134 may create the list on a system memory of storage system 130. In an example embodiment, the IDs contained in the created list may identify data records which have been compressed utilizing a low-ratio compression method.

Referring to step S215, compression program 134 may receive, via network 110, a read/write I/O operation from host computing device 120. Compression program 134 may process the received I/O operation on a data record basis. In an example embodiment, compression program 134 receives, from host computing device 120, data and a write I/O operation to write the data to storage 132 on a record basis.

Referring to step S220, compression program 134 may perform a first compression on the received data with a compression method that requires a low CPU load (e.g., a low-ratio compression method). By using a compression method with a low CPU load, compression program 134 avoids excess CPU utilization and adverse influences on system performance. Moreover, by performing a first compression on the received data, compression program 134 writes a smaller amount of data to storage 132. In an example embodiment, compression program 134 performs a first compression on the received data utilizing a low-ratio compression method.

Referring to step S225, compression program 134 may write the compressed data record to storage 132. In an example embodiment, when writing the data record, compression program 134 may add information including a record ID, identification of a utilized compression method, a compression ratio of the utilized compression method, record length before compression, and compressed record length as header information to the beginning of each data record. Furthermore, in embodiments of the invention, compression program 134 may notify the host computer (e.g., host computing device 120) of completion of the data record write processing. Additionally, compression program 134 may add the record ID of a compressed data record to a list of record IDs which correspond to and identify data records which have been subjected to a first compression processing. In an example embodiment, compression program 134, adds header information to the compressed data record from step S220, writes the compressed data record to storage 132, and adds the record ID of the compressed data record to the list created in step S210 which identifies data records which have been subjected to a first compression processing (i.e., the low-ratio compression method utilized in step S220).

Referring to step S230, compression program 134 may determine whether a host I/O operation processing is in progress or not. In embodiments of the present invention, compression program 134 may determine that host I/O operation processing is not in progress during a time period set by a user of HDC system 100 or a time period during which storage system 130 is determined as not processing a host I/O process. In an example embodiment, compression program 134 determines that an I/O operation of host computing device 120 is not in progress and proceeds to step S235. Compression program 134 may make this determination by monitoring the processing load (i.e., CPU load) of storage system 130 and determining that the processing load of storage system 130 is less than a predetermined level of CPU utilization.

Referring to step S235, in response to determining that an I/O operation of host computing device 120 is not in progress, compression program 134 may refer to a list of record IDs which correspond to data records that have been subjected to a first compression method to determine if an ID exists in the list. In an example embodiment, compression program 134 refers to the list created in step S210 which identifies data records which have been subjected to a first compression processing and determines that the record ID of the compressed data record, created in step S225, exits in the list which identifies data records which have been subjected to a first compression processing (i.e., the low-ratio compression method utilized in step S220).

Referring to step S240, in response to determining that a record ID entry is present in the list which identifies data records which have been subjected to a first compression processing, compression program 134 may read record header information, from storage 132, associated with the record ID entry. Additionally, compression program 134 may remove the record ID associated with the read header information from the list of record IDs which identifies data records that have been subjected to a first compression processing. In an example embodiment, compression program 134 reads, from storage 132, the header information associated with the record ID of the compressed data record created in step S225 and removes that record ID from the list of record IDs which identify data records that have been subjected to a first compression processing. The header information read by compression program 134 may include the following information of the compressed data record created in step S225: record ID, identification of the utilized compression method (e.g., compression ratio), record length before compression, and compressed record length.

Referring to step S245, having read the header information belonging to the compressed data record created in step S225, compression program 134 may determine whether or not the compression ratio of the compression method used to perform the first compression of the data record is less than a threshold value. If compression program 134 determines that the compression ratio is not less than the threshold value, compression program 134 may read header information associated with a next record ID, if any, present in the list of record IDs which identify data records that have been subjected to a first compression processing. However, if it is determined that the compression ratio is less than the threshold value, compression program 134 may proceed to step S250.

Referring to step S250, in response to determining that the compression ratio is less than the threshold value, compression program 134 may read the data record, from storage 132, by decompressing the data record with a decompression method corresponding to the compression method described in the header information of the data record onto a system memory. Compression program 134 may then perform a second compression on the decompressed data utilizing a high-ratio compression method. In an example embodiment, compression program 134 reads, from storage 132, the compressed data record created in step S225 by decompressing the data record with a decompression method corresponding to the compression method described in the header information of the data record and performs a second compression on the decompressed data utilizing a high-ratio compression method.

Referring to step S255, compression program 134 may write back to storage the data record which was subjected to a second compression utilizing a high-ratio compression method. Furthermore, compression program 134 may also update the header information of the data record to reflect the execution of the second compression process. In an example embodiment, compression program 134 writes back to storage 132 the compressed data record created in step S250 which was subjected to a second compression utilizing a high-ratio compression method. A data record that has been subjected to the second compression processing utilizing a high-ratio compression method may cause a free data space within storage 132 whose length corresponds to the difference between the first compression processing of the data record and the second compression processing of the data record. However, if a file system of storage system 130 supports Sparse File, the second compression processing causes no unnecessary consumption in the actual data storage area of storage 132. In other words, storage 132 is consumed only with as much amount of data as that consumed by the data record compressed with the second compression method from the beginning. Moreover, in an example embodiment, compression program 134 also updates the header information of the data record created in step S250 to include details resulting from the second compression utilizing a high-ratio compression method.

Performing the two-staged compression, i.e., compression with a low-compression ratio in Write I/O processing and compression with a high-compression ratio in delayed processing, results in a mixture of data records with different compression formats. However, those records are restored without any problem because each record has a record header which includes compression information.

In an embodiment where compression program 134 receives, from host computing device 120, read I/O operation to read a compressed data record stored within storage 132, compression program 134 may read the header information of the data record to be read, identify the implemented compression method of the data from the header information on the record basis, decompress the compressed data in accordance with the identified compression method(s), and send, via network 110, the decompressed data to host computing device 120.

Figure 5:
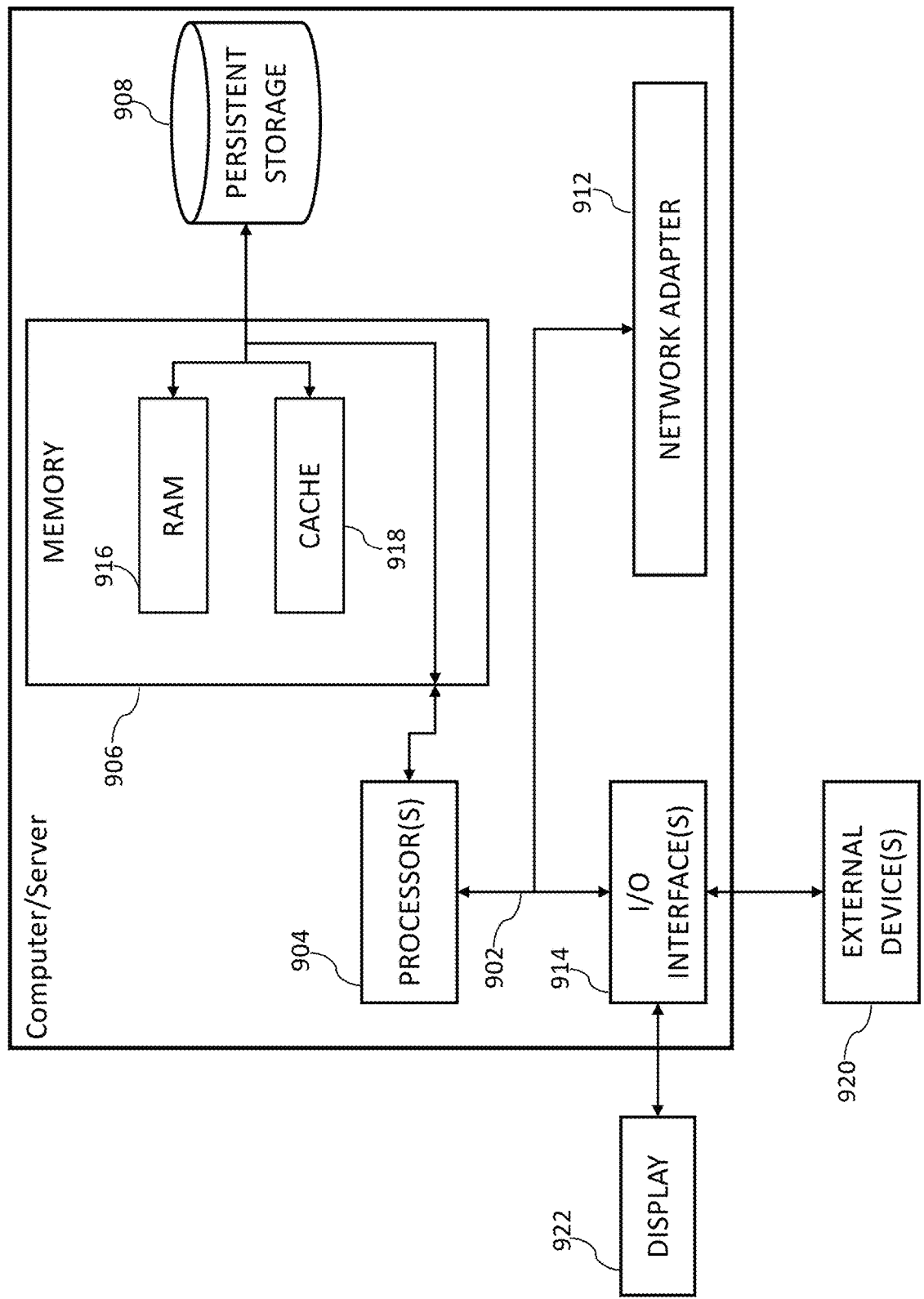
FIG. 5 is a block diagram depicting the hardware components of the high data compression system of FIG. 1, in accordance with an embodiment of the invention.

FIG. 5 depicts a block diagram of components of host computing device 120 and storage system 130 in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Host computing device 120 and storage system 130 include communications fabric 902, which provides communications between computer processor(s) 904, memory 906, persistent storage 908, network adapter 912, and input/output (I/O) interface(s) 914. Communications fabric 902 can be implemented with any architecture designed for passing data and/or control information between processors (such as microprocessors, communications and network processors, etc.), system memory, peripheral devices, and any other hardware components within a system. For example, communications fabric 902 can be implemented with one or more buses.

Memory 906 and persistent storage 908 are computer-readable storage media. In this embodiment, memory 906 includes random access memory (RAM) 916 and cache memory 918. In general, memory 906 can include any suitable volatile or non-volatile computer-readable storage media.

The compression program 134 in storage system 130 is stored in persistent storage 908 for execution by one or more of the respective computer processor(s) 904 via one or more memories of memory 906. In this embodiment, persistent storage 908 includes a magnetic hard disk drive. Alternatively, or in addition to a magnetic hard disk drive, persistent storage 908 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 908 may also be removable. For example, a removable hard drive may be used for persistent storage 908. Other examples include optical and magnetic disks, thumb drives, and smart cards that are inserted into a drive for transfer onto another computer-readable storage medium that is also part of persistent storage 908.

Network adapter 912, in these examples, provides for communications with other data processing systems or devices. In these examples, network adapter 912 includes one or more network interface cards. Network adapter 912 may provide communications through the use of either or both physical and wireless communications links (this could be a fiber channel). The compression program 134 in storage system 130 may be downloaded to persistent storage 908 through network adapter 912.

I/O interface(s) 914 allows for input and output of data with other devices that may be connected to host computing device 120 and storage system 130. For example, I/O interface 914 may provide a connection to external devices 920 such as a keyboard, keypad, a touch screen, and/or some other suitable input device. External devices 920 can also include portable computer-readable storage media such as, for example, thumb drives, portable optical or magnetic disks, and memory cards. Software and data used to practice embodiments of the present invention, e.g., compression program 134 in storage system 130, can be stored on such portable computer-readable storage media and can be loaded onto persistent storage 908 via I/O interface(s) 914. I/O interface(s) 914 can also connect to a display 922.

Display 922 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

While steps of the disclosed method and components of the disclosed systems and environments have been sequentially or serially identified using numbers and letters, such numbering or lettering is not an indication that such steps must be performed in the order recited and is merely provided to facilitate clear referencing of the method's steps. Furthermore, steps of the method may be performed in parallel to perform their described functionality.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 6:
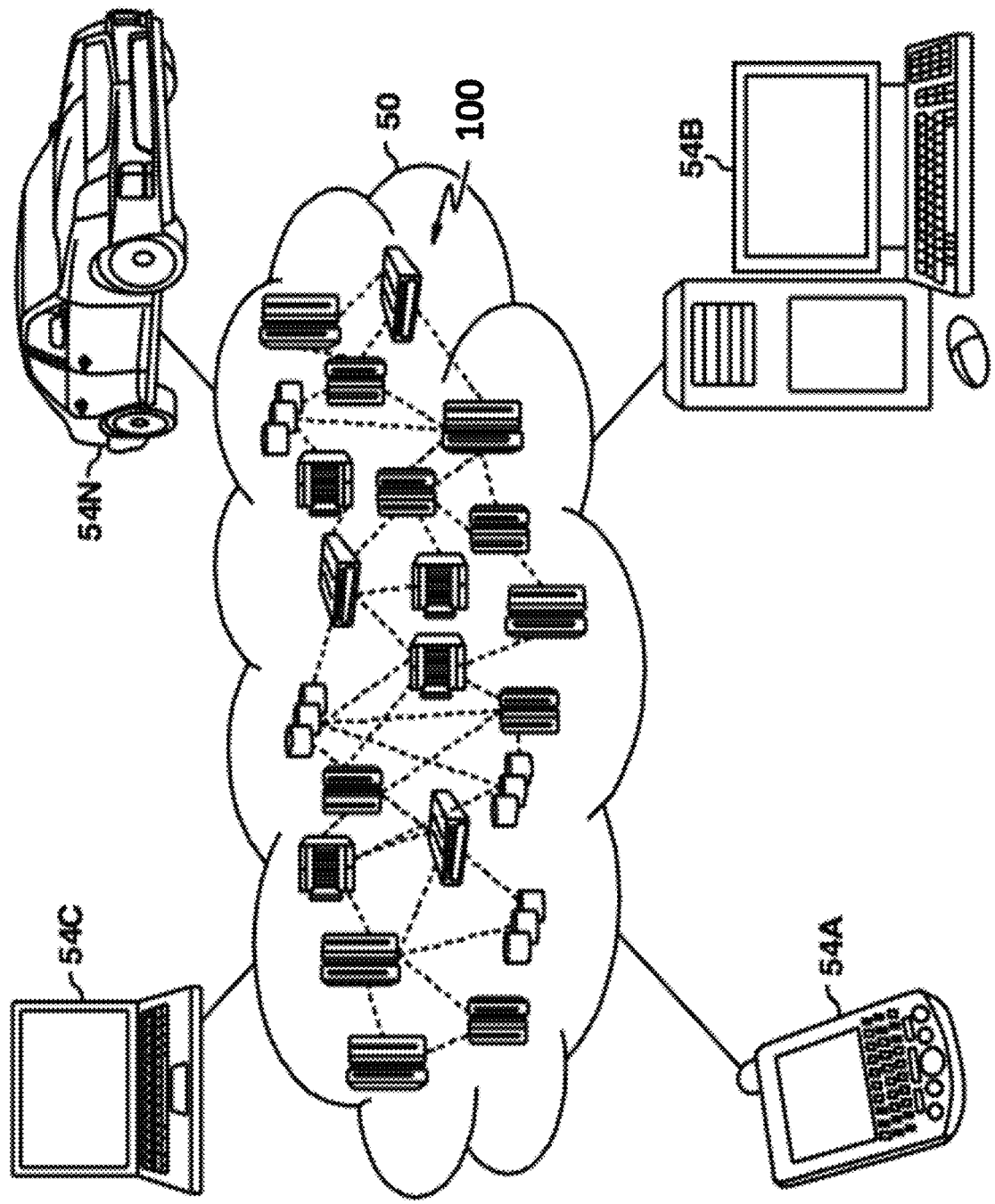
FIG. 6 depicts a cloud computing environment in accordance with an embodiment of the present invention.

Referring now to FIG. 6, illustrative cloud computing environment 50 is depicted. As shown, cloud computing environment 50 includes one or more cloud computing nodes 100 with which local computing devices used by cloud consumers, such as, for example, personal digital assistant (PDA) or cellular telephone 54A, desktop computer 54B, laptop computer 54C, and/or automobile computer system 54N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 6 are intended to be illustrative only and that computing nodes 100 and cloud computing environment 50 can communicate with any type of computerized device over any type of network and/or network addressable connection (e.g., using a web browser).

Figure 7:
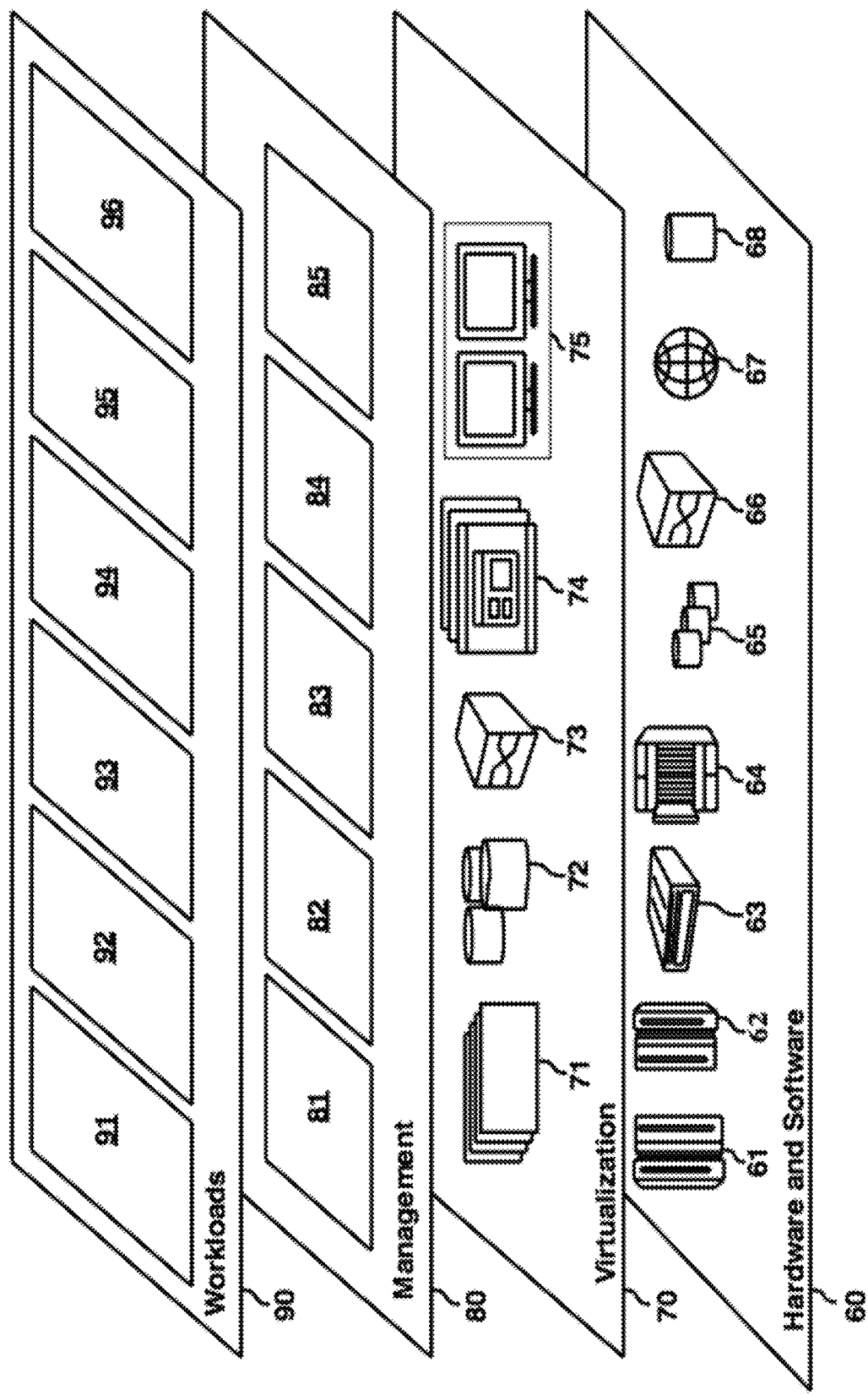
FIG. 7 depicts abstraction model layers in accordance with an embodiment of the present invention.

Referring now to FIG. 7, a set of functional abstraction layers provided by cloud computing environment 50 (FIG. 6) is shown. It should be understood in advance that the components, layers, and functions shown in FIG. 7 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and high data compression system 96. High data compression system 96 may relate to implementing a two-staged data compression process utilizing low-ratio compression and delayed high-ratio compression with data record header information.

The descriptions of the various embodiments of the present invention have been presented for purposes of illustration, but are not intended to be exhaustive or limited to the embodiments disclosed. The terminology used herein was chosen to explain the principles of the one or more embodiments, the practical application or technical improvement over technologies found in the marketplace, or to enable others of ordinary skill in the art to understand the embodiments. Various modifications, additions, substitutions, and the like will be apparent to those of ordinary skill in the art without departing from the scope and spirit of the invention, as defined in the following claims.

What is claimed is:

1. A computer-implemented method for saving data received from a host computing device to a storage system, wherein the storage system comprises at least one processor and at least one storage, the method comprising:

receiving an I/O operation to write the received data to the storage as a data record;

compressing the received data using a low-ratio compression method;

storing the data record to the storage, wherein the storing comprises creating a record header of the data record, and wherein the record header comprises a record ID and a compression ratio of a utilized compression method;

adding the record ID to a list, wherein the list only contains record IDs of data records which have been compressed using low-ratio compression;

in response to a processing load of the at least one processor being below a predetermined level of CPU utilization, referring to the list;

in response to the record ID being present on the list, referring to the compression ratio within the record header and removing the record ID from the list;

in response to the compression ratio being less than a threshold value, reading the data record from the storage and compressing decompressed data of the data record using a high-ratio compression method; and storing the data record back to the storage, wherein the storing comprises updating the record header to reflect utilization of the high-ratio compression method.

2. The computer-implemented method of claim 1, wherein the record header further comprises an identification of the utilized compression method, a record length before compression, and a compressed record length.

3. The computer-implemented method of claim 1, wherein the low-ratio compression method is performed by the at least one processor of the storage system or by compression hardware of the storage system.

4. The computer-implemented method of claim 1, wherein the processing load of the at least one processor of the storage system is determined as being less than the predetermined level when the storage system is not processing an I/O request from the host computing device during a time period set by a user or during a time period the storage system is determined as not processing an I/O request.

5. The computer-implemented method of claim 1, wherein the high-ratio compression method is performed by the at least one processor of the storage system or by compression hardware of the storage system.

6. The computer-implemented method of claim 1, wherein a file system of the storage system supports Sparse File.

7. The computer-implemented method of claim 1, further comprising:
identifying, in response to a read request from the host computing device, at least one record within the storage which corresponds to data requested by the read request;
decompressing the identified at least one record based on record header information of the at least one record; and
sending the decompressed record to the host computing device.

8. A computer program product for saving data received from a host computing device to a storage system, wherein the storage system comprises at least one processor and at least one storage, the computer program product comprising:
one or more computer-readable tangible storage devices and program instructions stored on at least one of the one or more computer-readable tangible storage devices, wherein the program instructions are executable by a computer, the program instructions comprising:
program instructions to receive an I/O operation to write the received data to the storage as a data record;
program instructions to compress the received data using a low-ratio compression method;
program instructions to store the data record to the storage, wherein the storing comprises creating a record header of the data record, and wherein the record header comprises a record ID and a compression ratio of a utilized compression method;
program instructions to add the record ID to a list, wherein the list only contains record IDs of data records which have been compressed using low-ratio compression;
in response to a processing load of the at least one processor being below a predetermined level of CPU utilization, program instructions to refer to the list;
in response to the record ID being present on the list, program instructions to refer to the compression ratio within the record header and remove the record ID from the list;
in response to the compression ratio being less than a threshold value, program instructions to read the data record from the storage and compress decompressed data of the data record using a high-ratio compression method; and
program instructions to store the data record back to the storage, wherein the storing comprises updating the record header to reflect utilization of the high-ratio compression method.

9. The computer program product of claim 8, wherein the record header further comprises an identification of the utilized compression method, a record length before compression, and a compressed record length.

10. The computer program product of claim 8, wherein the low-ratio compression method is performed by the at least one processor of the storage system or by compression hardware of the storage system.

11. The computer program product of claim 8, wherein the processing load of the at least one processor of the storage system is determined as being less than the predetermined level when the storage system is not processing an I/O request from the host computing device during a time period set by a user or during a time period the storage system is determined as not processing an I/O request.

12. The computer program product of claim 8, wherein the high-ratio compression method is performed by the at least one processor of the storage system or by compression hardware of the storage system.

13. A storage system for saving data received from a host computing device, the storage system comprising:
one or more processors, one or more computer-readable memories, one or more computer-readable tangible storage devices, and program instructions stored on at least one of the one or more computer-readable tangible storage devices for execution by at least one of the one or more processors via at least one of the one or more memories, the program instructions comprising:
program instructions to receive an I/O operation to write the received data to the one or more computer readable tangible storage devices as a data record;
program instructions to compress the received data using a low-ratio compression method;
program instructions to store the data record to the one or more computer readable tangible storage devices, wherein the storing comprises creating a record header of the data record, and wherein the record header comprises a record ID and a compression ratio of a utilized compression method;

program instructions to add the record ID to a list, wherein the list only contains record IDs of data records which have been compressed using low-ratio compression;

in response to a processing load of the one or more processors being below a predetermined level of CPU utilization, program instructions to refer to the list;

in response to the record ID being present on the list, program instructions to refer to the compression ratio within the record header and remove the record ID from the list;

in response to the compression ratio being less than a threshold value, program instructions to read the data record from the storage and compress decompressed data of the data record using a high-ratio compression method; and program instructions to store the data record back to the one or more computer readable tangible storage devices, wherein the storing comprises updating the record header to reflect utilization of the high-ratio compression method.

14. The storage system of claim 13, wherein the record header further comprises an identification of the utilized compression method, a record length before compression, and a compressed record length.

15. The storage system of claim 13, wherein the low-ratio compression method is performed by the one or more processors of the storage system or by compression hardware of the storage system.

16. The storage system of claim 13, wherein the processing load of the one or more processors of the storage system is determined as being less than the predetermined level when the storage system is not processing an I/O request from the host computing device during a time period set by a user or during a time period the storage system is determined as not processing an I/O request.

17. The storage system of claim 13, wherein the high-ratio compression method is performed by the one or more processors of the storage system or by compression hardware of the storage system.

* * * * *